(12) United States Patent
Ueyama et al.

(10) Patent No.: US 9,867,279 B2
(45) Date of Patent: Jan. 9, 2018

(54) ELECTRONIC DEVICE FOR VEHICLES

(71) Applicant: DENSO CORPORATION, Kariya, Aichi-pref. (JP)

(72) Inventors: Kengo Ueyama, Kariya (JP); Takaomi Hasegawa, Kariya (JP); Makoto Yoshida, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 15/029,182

(22) PCT Filed: Sep. 15, 2014

(86) PCT No.: PCT/JP2014/004745
§ 371 (c)(1),
(2) Date: Apr. 13, 2016

(87) PCT Pub. No.: WO2015/056402
PCT Pub. Date: Apr. 23, 2015

(65) Prior Publication Data
US 2016/0262259 A1 Sep. 8, 2016

(30) Foreign Application Priority Data

Oct. 18, 2013 (JP) ................. 2013-217396

(51) Int. Cl.
*H05K 5/00* (2006.01)
*H05K 1/02* (2006.01)
(Continued)

(52) U.S. Cl.
CPC ........... *H05K 1/0216* (2013.01); *G06F 1/182* (2013.01); *G06F 1/184* (2013.01); *H05K 1/0231* (2013.01);
(Continued)

(58) Field of Classification Search
CPC .. H05K 1/0216; H05K 1/0231; H05K 5/0247; H05K 7/142; H05K 9/0039; G06F 1/16; G06F 1/18
(Continued)

(56) References Cited

U.S. PATENT DOCUMENTS 4,967,316 A 10/1990 Goebel et al.
6,469,912 B1 * 10/2002 Chuang ................ H05K 9/0022
174/382

(Continued)

FOREIGN PATENT DOCUMENTS

EP 1367879 A2 12/2003
JP S6255399 U 4/1987
(Continued)

*Primary Examiner* — Hung S Bui
(74) *Attorney, Agent, or Firm* — Harness, Dickey & Pierce, P.L.C.

(57) ABSTRACT

An electronic device includes: a printed circuit board; a conductive casing; and a connecting part. The printed circuit board is mounted with an electronic component to configure a predetermined electronic circuit. The conductive casing stores the printed circuit board. The connecting part is arranged between the conductive casing and the printed circuit board, and is configured to be capacitively coupled with a conductor pattern of the printed circuit board so as to guide radiation noise from the printed circuit board to the conductive casing.

7 Claims, 2 Drawing Sheets

(51) Int. Cl.
*H05K 7/14* (2006.01)
*H05K 9/00* (2006.01)
*H05K 5/02* (2006.01)
*G06F 1/18* (2006.01)
*H05K 1/14* (2006.01)
*H05K 3/28* (2006.01)

(52) U.S. Cl.
CPC ........... *H05K 5/0247* (2013.01); *H05K 7/142* (2013.01); *H05K 9/0039* (2013.01); *H05K 1/0215* (2013.01); *H05K 1/144* (2013.01); *H05K 3/28* (2013.01); *H05K 2201/042* (2013.01); *H05K 2201/10409* (2013.01); *H05K 2201/2036* (2013.01)

(58) Field of Classification Search
USPC ................................. 361/728–730, 752, 794
See application file for complete search history.

(56) References Cited

U.S. PATENT DOCUMENTS

| | | | | |
|---|---|---|---|---|
| 7,310,236 | B2* | 12/2007 | Takahashi | H01B 1/24 |
| | | | | 348/E5.026 |
| 7,352,601 | B1* | 4/2008 | Minneman | H05K 1/0284 |
| | | | | 365/185.05 |
| 2004/0027819 | A1 | 2/2004 | Berberich | |
| 2008/0174973 | A1 | 7/2008 | Tanaka et al. | |
| 2016/0261292 | A1* | 9/2016 | Ikuma | H01L 23/057 |

FOREIGN PATENT DOCUMENTS

| | | |
|---|---|---|
| JP | H11031891 A | 2/1999 |
| JP | 2000244168 A | 9/2000 |
| JP | 2008176567 A | 7/2008 |
| JP | 2012146822 A | 8/2012 |
| JP | 2013207289 A | 10/2013 |

* cited by examiner

ELECTRONIC DEVICE FOR VEHICLES

CROSS REFERENCE TO RELATED APPLICATIONS

This application is a U.S. National Phase Application under 35 U.S.C 371 of International Application No. PCT/JP2014/004745 filed on Sep. 15, 2014 and published in Japanese as WO 2015/056402A1 on Apr. 23,2015. This application is based on and claims the benefit of priority from Japanese Patent Application No. 2013-217396 filed on Oct. 18, 2013. The entire disclosures of all the above applications are incorporated herein by reference.

TECHNICAL FIELD

The present disclosure relates to an electronics device for vehicles that includes a printed circuit board for constituting an electronic circuit.

BACKGROUND ART

With regard to the conventional electronic device, an electromagnetic wave as an interference wave may leak out from, for example, an electronic component and wiring pattern mounted on a printed circuit board and hence affects an external electronic device.

Accordingly, for the conventional electronic device, the electromagnetic wave emitted from the printed circuit board can be absorbed by arranging an electromagnetic wave absorbing sheet around the printed circuit board and connecting the ground pattern of the printed circuit board to a metal plate, which encloses a casing and the inner surface of the casing (for example, see Patent Literature 1).

In other words, the radiation noise above a regulated level can be prevented from leaking out from the electronic device by absorbing the electromagnetic wave emitted from the printed circuit board through the electromagnetic absorbing sheet or the casing.

PRIOR ART LITERATURES

Patent Literature

Patent Literature 1: JP-2008-176567 A

SUMMARY OF INVENTION

However, for example, when the specification for an electronic device is changed for saving cost, an existing component is used on the printed circuit board constituting, for example, a control circuit, and the size or shape of an electronic component or a peripheral device as a control object and the casing including the electronic component or the peripheral device is changed.

In this situation, since the surrounding environment of the printed circuit board changes, the grounding position to the casing side of the printed circuit board and the EMI (Electro Magnetic Interference) measure to the printed circuit board must be changed.

However, for changing the EMI measure to the printed circuit board, the existing printed circuit board cannot be used anymore and hence the cost for a printed circuit board (in addition to an electronic device) rises.

In particular, when, for example, a new EMI measure to the existing printed circuit board is carried out, on the printed circuit board, an electronic component is mounted on a position to be connected to the casing for the EMI measure, and resin film (the so-called solder resist) is formed for preventing soldering.

In this situation, one portion of the wiring pattern formed on the printed circuit is changed for offsetting the position of the electronic component, or one portion of the solder resist is peeled off. However, with regard to these methods, the existing printed circuit board cannot still be used and hence the cost or a printed circuit board (in addition to an electronic device) rises.

It is an object of the present disclosure to provide an electronic device for vehicles that enables EMI measure to be carried out without changing the configuration of a printed circuit board.

An electronic device for vehicles according to an aspect of the present disclosure includes: a printed circuit board that is mounted with an electronic component to configure a predetermined electronic circuit; and a conductive casing that stores the printed circuit board.

A connecting part is arranged between the conductive casing and a grounding surface of the printed circuit board, and is capacitively coupled with the grounding surface of the printed circuit board so as to guide radiation noise from the printed circuit board to the conductive casing. In addition, the connecting part is configured by a protruding part, which is arranged to protrude to the conductive casing and has gap between the conductor pattern and the protruding part, and is capacitively coupled with the conductor pattern through spacing arranged in the gap.

Accordingly, the radiation noise from the printed circuit board is guided to the conductive casing without making direction connection between a conductive member and the grounding surface of the printed circuit board.

The EMI measure may be performed without arranging a grounding pattern for connecting to the conductive casing at the printed circuit board and exposing the grounding pattern.

Accordingly, the printed circuit board is shared among different types of electronic devices with difference specification such as the shape or size of the conductive casing so that the mass production of the printed circuit board is achieved. Furthermore, the cost reduction for the printed circuit board in addition to the electronic device is also achieved.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

The following describes an embodiment of the present disclosure with reference to the drawings.

An electronic device for vehicles of the present embodiment is a display device 4 for a vehicle that includes a liquid display panel 2 having a display surface on which a touch panel is laminated.

Figure 1A:
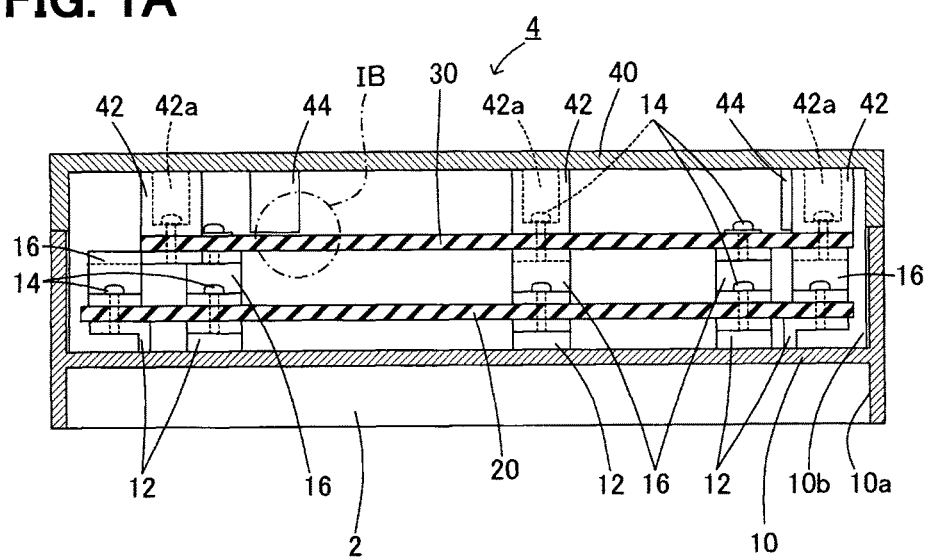
FIG. 1A is a cross-sectional view of the configuration of a display device according to an embodiment.
Figure 1B:
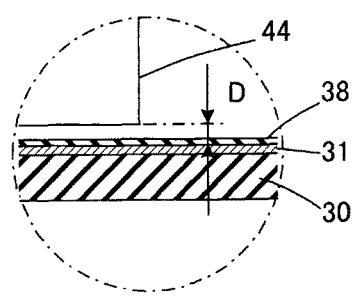
FIG. 1B is an enlarged diagram of the region IB in FIG. 1A.

As illustrated in FIG. 1A and FIG. 1B, the display device 4 of the present embodiment includes a main holder 10 in which a panel holder 10a is arranged for holding the liquid crystal panel 2 at the surface side (i.e., the lower side in FIG. 1A) and a board container 10b is arranged for storing two printed circuit boards 20, 30 at the rear surface side (i.e., the upper side in FIG. 1B).

The main holder 10 is configured by working a metal plate through, for example, pressing. A plurality of board holders 12 are distributed so as to be arranged to be parallel to the printed circuit board 10 with predetermined spacing at the rear surface side of the main holder 10. It is noted that the board holder 12 is configured by the metal plate that is similar to the main holder 10.

The printed circuit board 20 includes: a power source circuit; an input circuit that takes an operational signal from the touch panel arranged at the liquid crystal display panel 2; and an output circuit that outputs a video signal for display to the liquid crystal display panel 2.

Accordingly, the wiring pattern and ground pattern for constituting each of circuits on the printed circuit board 20. An electronic component 22 for constituting each of the circuits is mounted on the rear surface of the liquid crystal panel 2 at the opposite side. A connector 24 for connecting a vehicular battery or other external vehicular devices is also mounted at the rear surface side of the liquid crystal display panel 2.

In addition, the printed circuit board 20 is fixed to the board holder 12 through a male screw (hereinafter referred to as "screw") 14, whose head part is arranged with cross recess, such that the printed circuit board 20 has a potential level identical to the main holder 10.

Figure 2:
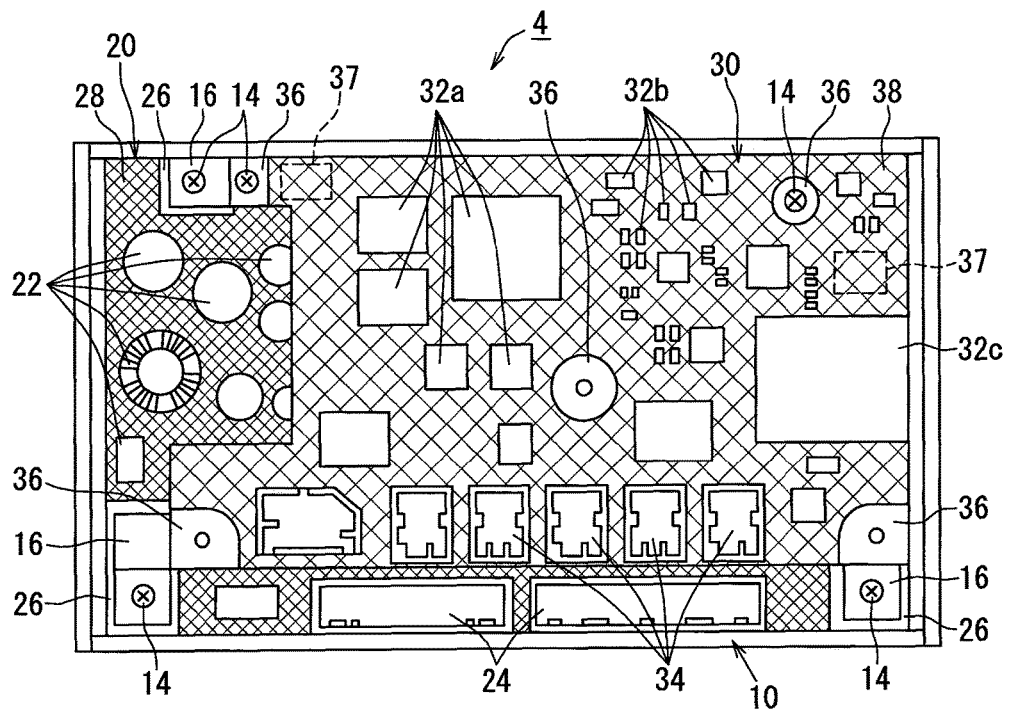
FIG. 2 is an explanatory diagram that shows a state of a printed circuit board inside the display device from a rear surface side.

It is noted that a solder resist 28 is carried out on the rear surface of the printed circuit board 20 excluding a soldering part of the electronic component 22 or the connector 24 and a grounding part 26, which is held by the board holder 12 and the screw 14 (see FIG. 2).

With regard to the fixing part where the printed circuit board 20 is fixed to the board holder 12, at the rear surface side of the printed circuit board 20, a board holder 16, which is arranged to be parallel to the printed circuit board 30 with predetermined spacing, is arranged at the rear surface side of the printed circuit board 20.

In addition, similar to the printed circuit board 20, the board holder 16 is fixed to the board holder 12 (in addition to the main holder 10) through the screw 14. It is noted that, as similar to the main holder 10 and the board holder 12, the board holder 16 is also configured by a metal plate.

The printed circuit board 30 is a main circuit board that is connected to a navigation device or an audio device mounted to a vehicle; and generates image data to be displayed at another display panel as the liquid crystal display panel 2 or a second display.

Accordingly, as shown in FIG. 2, the wiring pattern and ground pattern, which are for mounting a variety of electronic components including: an IC chip 32a such as an arithmetic circuit or a memory circuit required for image processing; a chip component 32b such as a resistor or a capacitor; and a card socket 32c for fitting a card-type flash memory (i.e., an SD card), are arranged at the printed circuit board 30, and these electronic components are mounted on the printed circuit board 30.

In addition, the printed circuit board 20 and the connector 34, which is used to connect a variety of peripheral devices such as a second display, navigation device, audio device, a transmitter for wirelessly sending an abnormal signal such as theft to outside of the vehicle, are mounted to the rear surface side of the printed circuit board 30.

In addition, the printed circuit board 30 is arranged to be parallel to the rear surface side of the printed circuit board 20 with predetermined spacing by fixing the printed circuit board 30 through the screw 14 to the board holder 16 arranged at the rear surface side of the printed circuit board 20.

Similar to the printed circuit board 20, a solder resist 38 is performed on the rear surface of the printed circuit board 30 excluding the part where a variety of electronic components 32a to 32c or the connector 34 is soldered and the grounding part 36 held by the board holder 16 and the screw 14.

In this manner, the printed circuit boards 20, 30 are fixed to the board storage 10b of the main holder 10 through the board holders 12, 16 in order. Subsequently, the printed circuit boards 20, 30 are stored inside the board storage 10, and the protective cover 40 for protecting the printed circuit boards 20, 30 from outside is fitted at the opening part of the board storage 10b by covering the printed circuit boards 20, 30 from the rear surface side.

The protective cover 40 includes a conductive casing storing the printed circuit boards 20, 30 that is similar to the main holder, and is configured by working a metal plate through, for example, pressing that is also similar to the main holder 10.

A fixing part 42 is abutted to one part of the plurality of grounding parts 36 (i.e., three of five locations at the bottom of the grounding parts 36) where the solder resist 38 is not arranged, and is fixed by the screw 14 at the board holder 16 with the printed circuit board 30. In addition, the fixing part 42 is protruded to the protective cover 40.

The fixing part 42 is arranged together with the protective cover 40 by forming a recess part 42a having a hole for inserting the screw 14 at the central part of the fixing part 42 by making the metal plate constituting the protective cover 40 dented toward the printed circuit board 30 side.

With regard to the display device 4, the printed circuit boards 20, 30 and protective cover 40 are fixed to the main holder 10 in the following procedures (1) to (4).

(1) Initially, by using the screw 14, the printed circuit board 20 and the board holder 16 are fixed to the board holder 12 arranged at the main holder 10.

(2) Next, the printed circuit board 30 is placed on the board holder 16, and then the printed circuit board 30 is fixed through the screw 14 to the board holder 16 arranged at the upper two locations illustrated in FIG. 2.

(3) Subsequently, the grounding part 36 of the printed circuit board 30 is held between the fixing part 42 and the remaining board holders 16 (i.e., the bottom three of the board holders in FIG. 2), which do not fix the printed circuit board 30 through the screw 4, by positioning the protective cover 4 from the top of the printed circuit board 30.

(4) Lastly, the screw 14 is fixed to the board holder 16 from outside of the protective cover 40 by putting the screw 14 through the hole arranged at the fixing part 42 of the protective cover 40.

The printed circuit board 20, 30 are surrounded by the main holder 10 and the protective cover 40; therefore, radiation noise emitted from the printed circuit board 20, 30 is blocked by the main holder 10 and the protective cover 40 so that the radiation noise above the regulated level can be prevented from leaking out.

However, as the predetermined EMI measurement is carried out for measuring radiation noise leaking out from the display device 4 by operating the display device 4, the radiation noise leaking out from the card socket 32c cannot be reduced to the tolerance level with the above configuration only.

It is considered that, at the printed circuit board 30, three locations at the bottom both ends and center illustrated in FIG. 2 are connected to the protective cover 40 through the fixing part 42; however, the upper part illustrated in FIG. 2 is not connected to the protective cover 40, the radiation noise generated at the upper part cannot flow to the protective cover 40.

For the display device 4 according to the present embodiment, in order to achieve the desired measurement result of the EMI test, two locations at the surrounding of the printed circuit board 30 (i.e., the upper two locations illustrated in FIG. 2), which are not directly connected to the protective cover 40, are configured as a capacitive coupling part 37 for making capacitance coupling between the ground pattern of the printed circuit board 30 and the protective cover 40.

Figure 3:
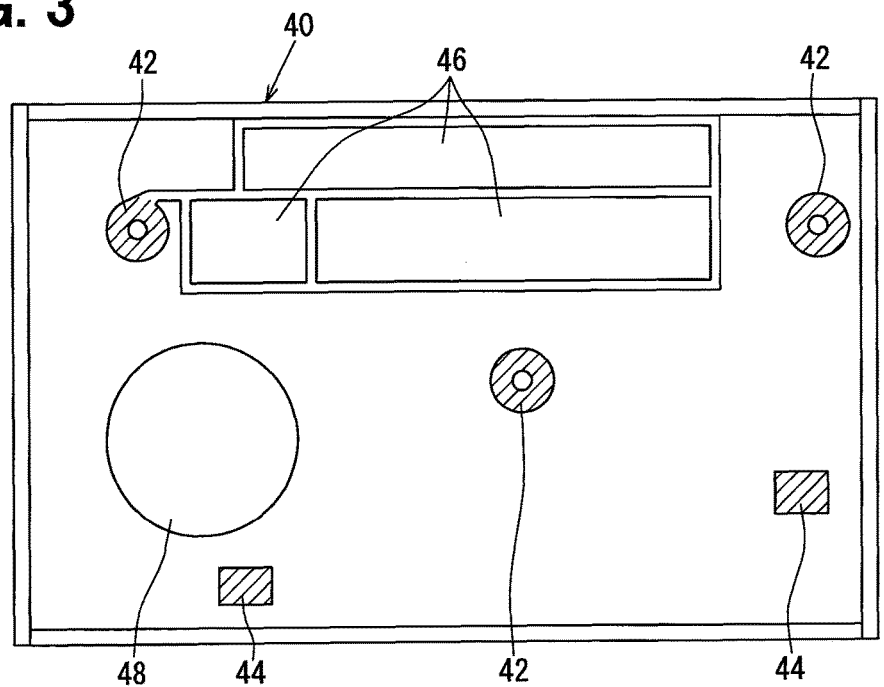
FIG. 3 is an explanatory diagram that shows the configuration of a protective cover provided at the rear surface side of the display device.

In particular, as shown in FIG. 3, at the protective cover 40, a protruding part 44 is arranged for making capacitive coupling with the ground pattern of the printed circuit board 30 at the position, which is opposite to the capacitive coupling part 37 when the protective cover 40 is put on the printed circuit board 30.

In FIG. 3, the reference numeral 46 represents a terminal insertion hole for inserting a terminal for connecting to the connectors 24, 34 provided at the printed circuit boards 20, 30; and the reference numeral 48 represents a fan attachment hole for attaching a cooling fan.

Accordingly, when the display device 4 is assembled with the procedures (1) through (4), as illustrated in the enlarged drawing in FIG. 1B, the gap D is formed between the protruding part 44 and the ground pattern 31 of the printed circuit board 30, and each of the parts is made to be capacitive coupling through the gap D.

Thus, for the display device 4 in the present embodiment, the radiation noise generated at the printed circuit board 30 flows to the protective cover 40 through the fixing part 42 and the protruding part 44, which are arranged at the center and the surrounding of the printed circuit board 30. Accordingly, with regard to the present embodiment, the radiation noise leaking out to the surrounding of the display device 4 can be effectively minimized.

With regard to the display device 4 in the present embodiment, the protruding part 44 is arranged for making capacitive coupling with the ground pattern of the printed circuit board 30 at the protective cover 40 for performing the EMI measure at the location where the solder resist 38 is arranged at the printed circuit board 30.

With regard to the display device 4 in the present embodiment, by arranging the protruding part 44 at the protective cover 40, the EMI measure can be carried out without changing the shape of the conductor pattern or solder resist at the printed circuit board 30.

Accordingly, with regard to the display device 4 of the present embodiment, the printed circuit board 30 used at the other display devices for other purpose may still be used. In addition, the display device 4 and other display devices may commonly use the printed circuit board 30. The present embodiment achieves the cost saving by increasing the versatility of the printed circuit board 30 and mass production of the printed circuit board 30.

Subsequently, through the capacitive coupling between the protruding part 44 arranged at the protective cover 40 and the ground pattern 31 of the printed circuit board 30, in order to check that the radiation noise can be reduced, the display device 4 is created and then the EMI test is performed for measuring the signal level of the radiation noise leaking out to the surrounding of the display device 4.

With regard to the EMI test, the signal level of a high frequency signal at a frequency of 950 MHz generated at the surrounding of the display device 4 is measured when operating the display device 4 in a case where a conductive gasket as the protruding part 44 is arranged at the protective cover 40 and in a case where the conductive gasket is not arranged at the protective cover 40.

As a result, the signal level of the high frequency signal in a case of not providing the gasket is 36 dBµV/m (about 63.10 µV/m); and the signal level of the high frequency signal in a case of providing the gasket is 27 dBµV/m (about 22.93 µV/m).

Accordingly, as comparing the case of providing the protruding part 44 at the protective cover 40 to the case of not providing the protruding part 44 at the protective cover 40, the radiation noise is reduced by a level at about 40 µV/m.

In this EMI test, since the gasket is abutted to the printed circuit board 30, the gap D between the protruding part 44 and the ground pattern 31 of the printed circuit board 30 is the thickness of the solder resist 38.

It is considered that the effect of decreasing radiation noise through the protruding part 44 is changed through the capacitive coupling between the protruding part 44 and the ground pattern of the printed circuit board 30. In addition, it is considered that the effect of decreasing radiation noise is lowered when the tip part of the protruding part 44 cannot be abutted to the solder resist 38 at the surface of the printed circuit board 30.

When the signal level of the high frequency signal leaking out to the surrounding of the display device 4 is measured for the degree of variation as the gap D gets larger, the signal level of the high frequency signal in a case of the gap D set at 1.5 mm is 33 dBµV/m. The decreasing effect of the radiation noise can be achieved even when the gap D is made larger.

When the present disclosure is applied to the electronic device, in view of product dispersion, the number or size of protruding parts for making capacitive coupling with the conductive pattern of the printed circuit board and the gap (i.e., gap D) between the protruding part and the conductor pattern of the printed circuit board may be properly configured so as to allow the radiation noise leaking out from the electronic device to be at the tolerance level.

(Modification Example)

The above describes one aspect of the present disclosure. However, the present disclosure is not limited to the above embodiment. Several embodiments may be made given that the variation is made within the scope of the present disclosure.

For example, the above embodiment describes that the protruding part 44 is arranged at the protective cover 40 made of a conductive casing as a connecting part for capacitance coupling with the printed circuit board 30. However, the gasket, which can be directly abutted to the board surface of the printed circuit board 30 where the solder resist 38 is arranged.

The number of components for EMI measure is increased by the part of gaskets. However, since the gap D between the conductive casing and the conductor pattern of the printed circuit board may be configured at the thickness of the solder resist 38, the radiation noise toward the conductive casing can be effectively absorbed.

The above embodiment describes that the conductor pattern, which is capacitive coupled with the protruding part 44 as the connecting part, is the ground pattern of the printed circuit board 30. However, the protruding part 44 may be arranged to have capacitive coupling with the wiring pattern formed on the printed circuit board 30. Therefore, an unnecessary high frequency signal flowing into the wiring pattern of the printed circuit board 30 can be absorbed by the conductive casing.

The above embodiment describes that the main holder 10 and the protective cover 40 for constituting the conductive casing are configured by the metal plate. However, the conductive main holder 10 and the conductive protective cover 40 may also absorb (or shield) the radiation noise from the printed circuit board. Accordingly, the main holder 10 and the protective cover 40 may be configured by, for example, conductive resin as the conductive casing. Alternatively, a metal plate may be adhered to a non-conductive resin casing.

What is claimed is:

1. An electronic device for vehicles, comprising:
   a printed circuit board that is mounted with an electronic component to configure a predetermined electronic circuit;
   a conductive casing that stores the printed circuit board; and
   a conductive connecting part that is connected to the conductive casing, and is configured to be capacitively coupled with a conductor pattern of the printed circuit board so as to guide radiation noise from the printed circuit board to the conductive casing,
   wherein the conductive connecting part is configured by a protruding part, which is arranged to protrude from the conductive casing and forming a gap between the conductor pattern and the protruding part, and is capacitively coupled with the conductor pattern through spacing arranged in the gap.

2. The electronic device for vehicles according to claim 1, wherein:
   a resin film for preventing from being soldered is arranged at a board surface of the printed circuit board to be capacitively coupled with the conductive connecting part; and
   the conductive connecting part is capacitively coupled with the conductor pattern of the printed circuit board through the resin film and the spacing.

3. The electronic device for vehicles according to claim 2, wherein the gap between the conductor pattern and the protruding part is equal to a thickness of the resin film.

4. The electronic device for vehicles according to claim 1, wherein:
   at the printed circuit board, a plurality of grounding parts for directly connecting to the conductive casing are respectively distributed at diverse positions, which are different from a position of the conductor pattern to be capacitively coupled with the conductive connecting part; and
   the radiation noise from the printed circuit board is reduced through capacitive coupling between the conductive connecting part and the conductive casing and the direct connection between each of the plurality of grounding parts and the conductive casing.

5. The electronic device for vehicles according to claim 1, further comprising:
   a display panel, which is arranged on the conductive casing.

6. The electronic device for vehicles according to claim 1, further comprising:
   a capacitive coupling part, wherein the protruding part is arranged for making a capacitively coupling with the conductor pattern at a position which is opposite to the capacitive coupling part.

7. The electronic device for vehicles according to claim 1, wherein when a thickness of the gap measures 1.5 mm, a signal level of a high frequency signal measures 33 dBµV/m.

* * * * *